(12) United States Patent
Tsuji et al.

(10) Patent No.: US 7,147,900 B2
(45) Date of Patent: Dec. 12, 2006

(54) METHOD FOR FORMING SILICON-CONTAINING INSULATION FILM HAVING LOW DIELECTRIC CONSTANT TREATED WITH ELECTRON BEAM RADIATION

(75) Inventors: Naoto Tsuji, Tama (JP); Atsuki Fukazawa, Tama (JP); Nobuo Matsuki, Tama (JP); Shingo Ikeda, Tama (JP)

(73) Assignee: ASM Japan K.K., Tokyo (JP)

( * ) Notice: Subject to any disclaimer, the term of this patent is extended or adjusted under 35 U.S.C. 154(b) by 523 days.

(21) Appl. No.: 10/641,397

(22) Filed: Aug. 14, 2003

(65) Prior Publication Data

US 2005/0034667 A1   Feb. 17, 2005

(51) Int. Cl.
*H05H 1/24* (2006.01)
*B05D 3/06* (2006.01)

(52) U.S. Cl. .................. 427/551; 427/578; 427/579

(58) Field of Classification Search ............. 427/578, 427/579, 585, 588, 596, 551
See application file for complete search history.

(56) References Cited

U.S. PATENT DOCUMENTS

| | | | | |
|---|---|---|---|---|
| 4,327,273 A | * | 4/1982 | Kita et al. ............. | 219/121.13 |
| 4,585,537 A | * | 4/1986 | Nakayama et al. ......... | 427/570 |
| 4,711,807 A | * | 12/1987 | Yamamoto et al. ......... | 428/334 |
| 4,717,585 A | * | 1/1988 | Ishihara et al. ............. | 427/568 |
| 5,082,685 A | * | 1/1992 | Morooka .................... | 427/577 |
| 5,466,617 A | | 11/1995 | Shannon | |
| 6,057,251 A | | 5/2000 | Goo et al. | |
| 6,204,172 B1 | * | 3/2001 | Marsh ....................... | 438/653 |
| 6,404,115 B1 | * | 6/2002 | Sanderson ............... | 313/359.1 |
| 6,444,478 B1 | * | 9/2002 | Basceri et al. ................. | 438/3 |
| 6,452,338 B1 | * | 9/2002 | Horsky .................. | 315/111.81 |
| 6,582,777 B1 | | 6/2003 | Ross et al. | |
| 6,784,123 B1 | | 8/2004 | Matsuki et al. | |
| 6,936,551 B1 | * | 8/2005 | Moghadam et al. ........ | 438/780 |
| 6,946,034 B1 | * | 9/2005 | Bruce et al. ................ | 118/719 |
| 7,056,560 B1 | * | 6/2006 | Yim et al. .................. | 427/551 |

FOREIGN PATENT DOCUMENTS

JP   10-107026   4/1998

* cited by examiner

*Primary Examiner*—Bret Chen
(74) *Attorney, Agent, or Firm*—Knobbe, Martens Olson & Bear LLP

(57) ABSTRACT

A silicon-containing insulation film is formed on a substrate by plasma reaction using a reaction gas including (i) a source gas comprising a silicon-containing hydrocarbon compound containing multiple cross-linkable groups, (ii) a cross-linking gas, and (iii) an inert gas, into a reaction chamber where a substrate is placed. The insulation film is then exposed to electron beam radiation, thereby increasing mechanical strength of the film without substantial alternation of its dielectric constant.

36 Claims, 3 Drawing Sheets

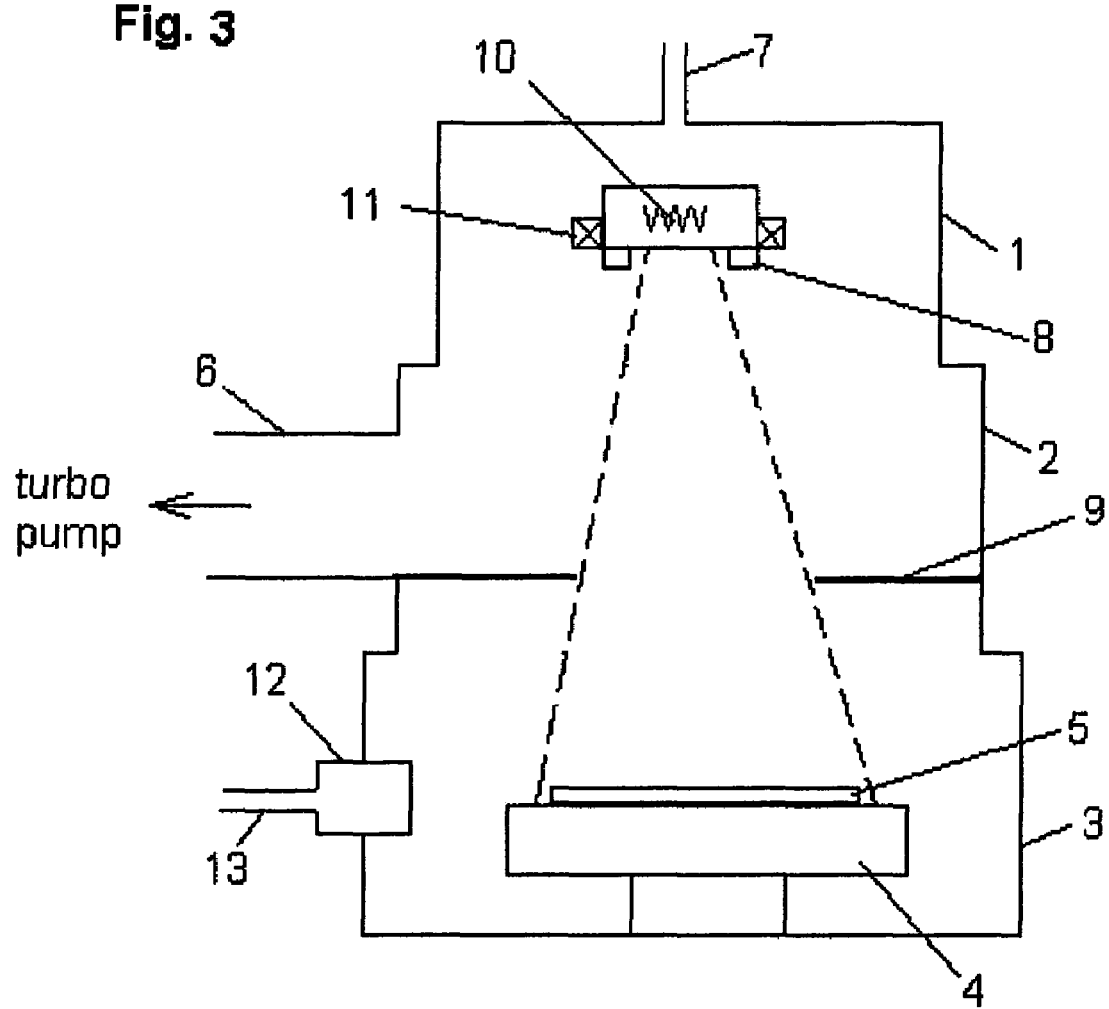

METHOD FOR FORMING SILICON-CONTAINING INSULATION FILM HAVING LOW DIELECTRIC CONSTANT TREATED WITH ELECTRON BEAM RADIATION

BACKGROUND OF THE INVENTION

1. Field of the Invention

The present invention relates to a method and an apparatus for forming a silicon-containing insulation film having a low dielectric constant.

2. Description of the Related Art

As semiconductors have progressed to accommodate a demand for high speed and high density in recent years, a reduction of capacitance between lines is required to avoid signal delays in the multi-layer wiring technology field. Because a reduction in the dielectric constant of a multi-layer wiring insulation film is required in order to reduce the capacitance between lines, insulation films having low dielectric constants have been developed.

Conventionally, silicon oxide (SiOx) film is formed by adding oxygen ($O_2$) or nitric oxide ($N_2O$) as an oxidizing agent to a silicon source gas such as $SiH_4$ and $Si(OC_2H_5)_4$ and applying heat or plasma energy to the source gas. A dielectric constant ($\epsilon$) of this film was approximately 4.0.

By contrast, by using a spin-coat method using inorganic silicon oxide glass (SOG) materials, a low dielectric constant insulation film having a dielectric constant ($\epsilon$) of approximately 2.3 was formed.

By using a plasma CVD method with CxFyHz as a source gas, a low dielectric constant fluorinated amorphous carbon film having a dielectric constant ($\epsilon$) of approximately 2.0–2.4 was formed.

Further, by using a plasma CVD method using a silicon-containing hydrocarbon (for example, P-TMOS (phenyltrimethoxysilane) as a source gas, a low dielectric constant insulation film having a dielectric constant ($\epsilon$) of approximately 3.1 was formed.

Additionally, by using a plasma CVD method using a silicon-containing hydrocarbon having multiple alkoxy groups as a source gas, a low dielectric constant insulation film having a dielectric constant ($\epsilon$) of approximately 2.5 was formed when optimizing film formation conditions.

However, the above-mentioned conventional approaches have the following problems:

In the case of the inorganic SOG insulation film formed by the spin-coat method, there are problems in that the materials properties are not distributed equally on a silicon substrate and that a device used for a curing process after coating the material is expensive.

In the case of the fluorinated amorphous carbon film by the plasma CVD method using CxFyHz as a source gas, there are problems such as low heat resistance (370° C.), poor adhesion with silicon materials, and low mechanical strength of the film formed.

Furthermore, among silicon-containing hydrocarbons, when P-TMOS is used, a polymerized oligomer cannot form a linear structure such as a siloxane polymer because P-TMOS contains three alkoxy groups. Consequently, a porous structure is not formed on a silicon substrate, and hence a dielectric constant cannot be reduced to a desired degree.

Additionally, when a silicon-containing hydrocarbon containing multiple alkoxy groups is used, a polymerized oligomer can form a linear structure such as a siloxane polymer by optimizing film formation conditions. Consequently, a porous structure can be formed on a silicon substrate and a dielectric constant can be reduced to a desired degree. However, there are problems in that oligomers having the linear structure have weak bonding power therebetween and thus the mechanical strength of a resultant film is low.

SUMMARY OF THE INVENTION

In view of the above-mentioned problems, an object of the present invention is to provide a method and an apparatus for forming an insulation film having a low dielectric constant and high mechanical strength.

Another object of the present invention is to provide a method for forming an insulation film having a low dielectric constant without increasing device costs.

In an embodiment of the present invention, a method for forming a silicon-containing insulation film on a substrate, comprising the steps of: (a) introducing a reaction gas comprising (i) a source gas comprising a silicon-containing hydrocarbon compound containing multiple cross-linkable groups, (ii) a cross-linking gas, and (iii) an inert gas, into a reaction chamber where a substrate is placed; (b) applying radio-frequency power to create a plasma reaction space inside the reaction chamber; (c) controlling a flow of the reaction gas and an intensity of the radio-frequency power to obtain a silicon-containing insulation film on the substrate; and (d) exposing the insulation film to electron beam radiation in an electron beam apparatus. In the above, the electron beam radiation may be conducted to increase mechanical strength of the insulation film without substantially altering its dielectric constant. Although the above insulation film has a porous structure, the structure already possesses relatively high mechanical strength, and thus, by electron beam treatment, the structure is not collapsed and the density of the film may be not changed significantly. Accordingly, it is possible to increase mechanical strength of the insulation film without substantially altering its dielectric constant.

In this connection, in the present invention, preferably, prior to the electron beam irradiation, the insulation film may have an elastic modulus of 5.0 GPa or higher, and a dielectric constant of 2.8 or lower, so that the electron beam irradiation may be conducted to increase the elastic module by 1–10 GPa without substantially altering the dielectric constant.

In an embodiment, the electron beam radiation comprises the steps of: (I) placing the substrate in a process chamber; (II) evacuating an electron beam gun chamber which is connected to the process chamber, wherein a partition wall is disposed between the process chamber and the electron beam gun chamber, said partition wall having an aperture; and (III) emitting electrons from an electron beam gun provided in the electron beam gun chamber toward the substrate through the aperture. In the above, the pressure in the process chamber may be $10^{-6}$ to $10^{-5}$ Torr in an embodiment. Alternatively, the electron beam radiation may also comprise the steps of: (I) placing the substrate in a process chamber; (II) introducing an inert gas (such as helium) into an electron beam gun chamber which is connected to the process chamber, wherein a partition wall is disposed between the process chamber and the electron beam gun chamber, said partition wall having an aperture; and (III) emitting electrons from an electron beam gun provided in the electron beam gun chamber toward the substrate through the aperture while discharging the inert gas from the electron beam apparatus. In the above, the pressure in the process chamber may be $10^{-6}$ to $10^{-4}$ Torr in an embodiment. In the above, the electron beam gun may comprise a single filament and an anode, and the aperture is configured along outer loci of electrons emitted from the filament onto the substrate.

In the present invention, preferably, electrons may be emitted from a single filament in an irradiation area of 25–3,125 cm². The area can vary depending on the size of the substrate and the number of the substrates to be processed simultaneously in the process chamber, for example. Further, the electron beam dose may be 50–10,000 μC/cm². Because the efficiency is high in the present invention, even when the dose of 2,000 μC/cm² or lower can be effective. In an embodiment, the dose of 100–500 μC/cm²/min (including 200–300 μC/cm²/min) is effective.

The compounds usable in the present invention will be explained in detail later. However, for example, the following may be used: The cross-linkable groups of the silicon-containing hydrocarbon compound are alkoxy groups and/or vinyl groups. The cross-linking gas is selected from the group consisting of alcohol, ether, unsaturated hydrocarbon, $CO_2$, and $N_2$. The reaction gas further comprises an oxygen-supplying gas. The cross-linking gas is a $C_{2-4}$ alkanol. The cross-linking gas is a $C_{2-4}$ ether. The cross-linking gas is a $C_{2-4}$ unsaturated hydrocarbon. The cross-linking gas is supplied at a flow rate effective to cross link oligomers of compounds of the source gas, thereby increasing hardness of an insulation film formed on the substrate. The reaction gas is excited upstream of the reaction chamber. In an embodiment, the intensity of the radio-frequency power maybe 1.5 W/cm² or higher.

Further, in another embodiment, a method for forming a silicon-containing insulation film on a substrate, may comprise the steps of: (a) introducing a reaction gas comprising (i) a source gas comprising a silicon-containing hydrocarbon compound containing plural alkoxy groups, (ii) a cross-linking gas selected from the group consisting of $C_{1-6}$ alkanol, $C_{1-6}$ ether, $C_{1-6}$ unsaturated hydrocarbon, $CO_2$, and $N_2$, and (iii) an inert gas, into a reaction chamber where a substrate is placed; (b) applying radio-frequency power to create a plasma reaction space inside the reaction chamber; (c) controlling a flow of the reaction gas and an intensity of the radio-frequency power; and (d) exposing the insulation film to electron beam radiation in an electron beam apparatus.

In another aspect, the present invention includes a method for increasing mechanical strength of a silicon-containing insulation film formed on a substrate, comprising the steps of: (I) mixing a cross-linking gas selected into a source gas comprising a silicon-containing hydrocarbon compound containing cross-linkable groups, with an inert gas; (II) introducing the mixture gas as a reaction gas into a reaction chamber where a substrate is placed; (III) applying radio-frequency power to create a plasma reaction space inside the reaction chamber; (IV) controlling a flow of the reaction gas and an intensity of the radio-frequency power; and (V) exposing the insulation film to electron beam radiation in an electron beam apparatus. In the above, the radio-frequency power may be a combination of high-frequency power and low-frequency power. The high-frequency power may have a frequency of 2 MHz or higher, and the lower-frequency power may have a frequency of less than 2 MHz. The cross-linkable groups of the silicon-containing hydrocarbon compound may be alkoxy groups and/or vinyl groups. The cross-linking gas may be selected from the group consisting of alcohol, ether, unsaturated hydrocarbon, $CO_2$, and $N_2$.

In the present invention, by using specific electron beam processing systems, various types of films can be treated. In this aspect, a method for producing a substrate having a silicon-containing insulation film formed thereon, may comprise the steps of: (A) forming a silicon-containing insulation film on a substrate by plasma reaction in a plasma CVD apparatus; and (B) exposing the insulation film to electron beam radiation in an electron beam apparatus, wherein the electron beam radiation comprises the steps of: (a) placing the substrate in a process chamber; (b) evacuating an electron beam gun chamber which is connected to the process chamber, wherein a partition wall is disposed between the process chamber and the electron beam gun chamber, said partition wall having an aperture; and (c) emitting electrons from an electron beam gun provided in the electron beam gun chamber toward the substrate through the aperture, wherein the electron beam gun comprises a filament and an anode, and the aperture is configured along outer loci of electrons emitted from the filament onto the substrate. Alternatively, a method for producing a substrate having a silicon-containing insulation film formed thereon, may comprise the steps of: (A) forming a silicon-containing insulation film on a substrate by plasma reaction in a plasma CVD apparatus; and (B) exposing the insulation film to electron beam radiation in an electron beam apparatus, wherein the electron beam radiation comprises the steps of: (a) placing the substrate in a process chamber; (b) introducing an inert gas into an electron beam gun chamber which is connected to the process chamber, wherein a partition wall is disposed between the process chamber and the electron beam gun chamber, said partition wall having an aperture; and (c) emitting electrons from an electron beam gun provided in the electron beam gun chamber toward the substrate through the aperture while discharging the inert gas from the electron beam apparatus, wherein the electron beam gun comprises a filament and an anode, and the aperture is configured along outer loci of electrons emitted from the filament onto the substrate. The conditions described above can be applied to the above embodiment. In an embodiment, the aperture is circular or is formed in a truncated conical shape. However, the shape of the aperture can vary depending on the arrangement of substrates in the process chamber, for example. A square, rectangular, oval shape and the like can be used.

In the above, preferably, prior to the electron beam irradiation, the insulation film may have an elastic modulus of 5.0 GPa or higher (more preferably 7.0 GPa or higher, e.g., 8.0–12.0 GPa), and a dielectric constant of 2.8 or lower (however, in some cases, 2.9, 3.0), so that the electron beam irradiation may be conducted to increase the elastic module by 1–10 GPa without substantially altering the dielectric constant.

Additionally, the method may further comprise generating magnetic fields separately in the x-axis and in the y-axis with respect to a surface of the insulation film to control loci of electrons to scan two-dimensionally the surface of the insulation film. The frequency used for the x-axis may be 10–100 Hz, and the frequency used for the y-axis may be 100–1,000 Hz. Further, the frequency used for the y-axis may not be mathematically divisible by the frequency used for the x-axis.

In still another aspect, the present invention includes an electron-beam irradiation apparatus for treating a film formed on a substrate, comprising: (i) an electron beam gun chamber comprising a filament electron-beam gun comprised of a single filament and an anode for generating electrons, and a coil for controlling loci of electrons; (ii) a process chamber for processing a substrate, connected to the electron beam gun chamber, said process chamber comprising a supporting structure for supporting a substrate; and (iii) a partition wall disposed between the process chamber and the electron beam gun chamber, said partition wall having an aperture configured based on outer loci of electrons emitted from the filament onto the substrate; and (iv) an exhaust system disposed in the vicinity of the aperture.

In embodiments, the following may be employed: The filament, anode, aperture, and the supporting structure are disposed co-axially; the aperture is circular; the aperture is formed by a truncated conical shape; the aperture is configured along the outer loci of electrons; the exhaust system is disposed upstream of the aperture; the coil is for generating magnetic fields separately in the x-axis and in the y-axis with respect to a surface of the substrate to control loci of electrons to scan two-dimensionally the surface of the substrate.

In another embodiment, the apparatus may further comprise an intermediate chamber disposed between the electron beam gun chamber and the process chamber, and the intermediate chamber is provided with the exhaust system, wherein the partition wall is provided in the intermediate chamber or between the intermediate chamber and the process chamber. In still another embodiment, the apparatus may further comprise a static electricity eliminator provided in the process chamber, said static electricity eliminator being selected from the group consisting of a UV radiation device and a device for introducing an ionized gas into the process chamber.

The process chamber can be configured to be connected to a multi-chamber type plasma CVD apparatus, so that an entire system can be constituted.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 3 is a schematic diagram illustrating a configuration of an electron beam apparatus in a further alternative embodiment of the present invention.

DETAILED DESCRIPTION OF THE PREFERRED EMBODIMENT

Figure 1:
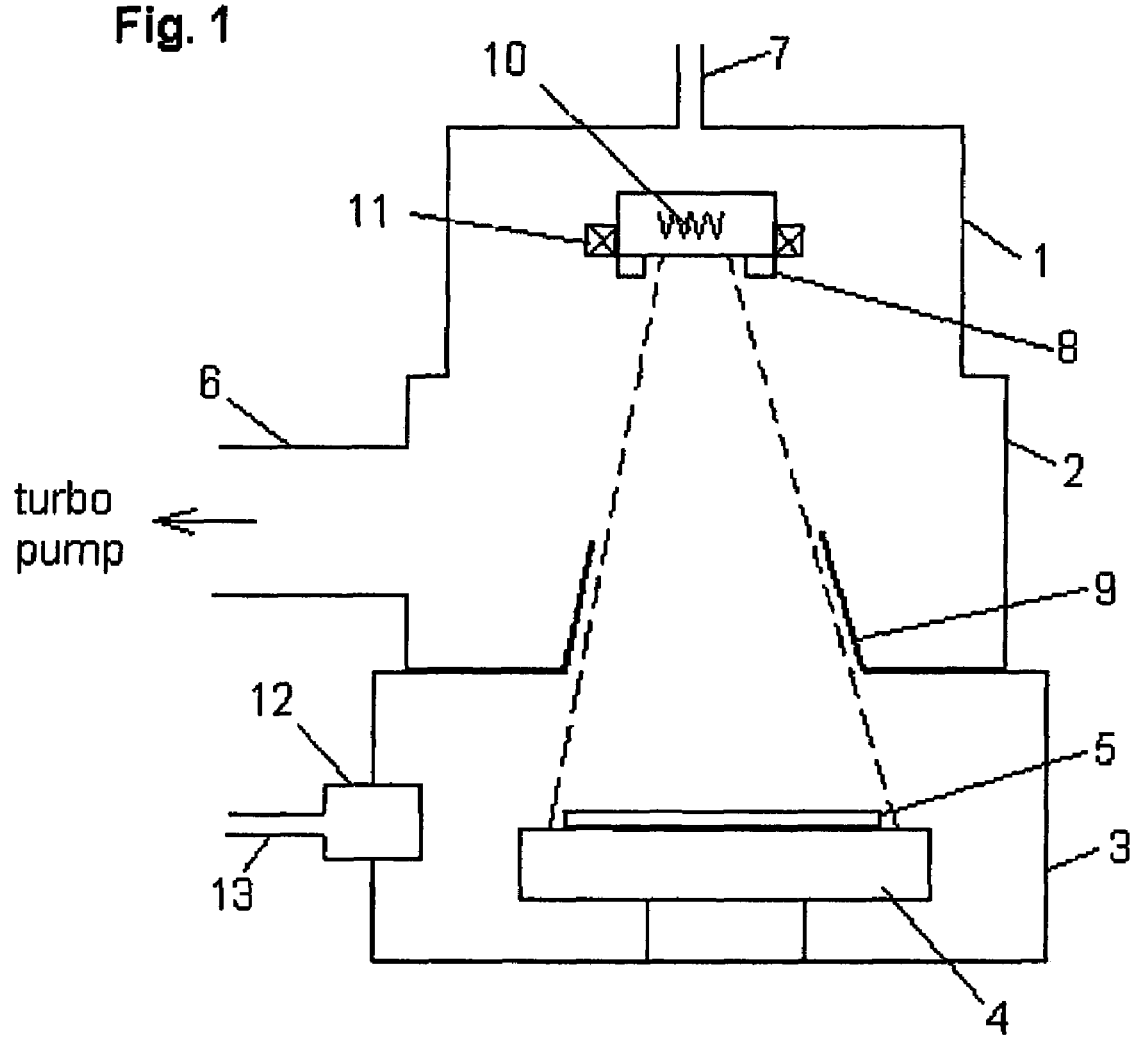
FIG. 1 is a schematic diagram illustrating a configuration of an electron beam apparatus in an embodiment of the present invention.

In a first invention of the present invention, as a first step, by using a plasma CVD method, a silicon-containing insulation film having a low dielectric constant and relatively high mechanical strength is formed; as a second step, the mechanical strength of the insulation film formed is further increased by electron beam treatment.

As a method for forming a low dielectric constant insulation film by using a plasma CVD method, a usable method comprises a step of introducing a reaction gas comprising (i) a source gas comprising a silicon-containing hydrocarbon compound containing multiple cross-linkable groups, (ii) an inert gas, (iii) an oxygen-supplying gas according to need, and (iv) a cross-linking gas further according to need, into a reaction chamber where a substrate is placed; a step of applying radio-frequency power to create a plasma reaction space inside the reaction chamber; and a step of controlling a flow of the reaction gas and an intensity of the radio-frequency power. By using a silicon-containing hydrocarbon compound containing cross-linkable groups as a source gas, a dielectric film having high mechanical strength can be obtained in spite of having a porous structure. In the above, in an embodiment, the cross-linkable groups of the silicon-containing hydrocarbon compound are alkoxy groups and/or vinyl groups. The oxygen-supplying gas may be selected from the group consisting of $O_2$ and $N_2O$. Further, in an embodiment, the cross-linkable gas may be selected from the group consisting of alcohol, ether, unsaturated hydrocarbon, $CO_2$, and $N_2$. Alcohol may be selected from the group consisting of, for example, $C_{1-6}$ aklanol and $C_{4-12}$ cycloalkanol. Unsaturated hydrocarbon may be selected from the group consisting of $C_{1-6}$ unsaturated hydrocarbon, a $C_{4-12}$ aromatic hydrocarbon unsaturated compound, and a $C_{4-12}$ alicyclic hydrocarbon unsaturated compound. Ether may be selected from the group consisting of $C_{3-20}$ ether and a $C_{5-12}$ cycloalkanol vinyl compound.

Additionally, in an embodiment, the source gas may be a compound having the formula $Si_\alpha O_{\alpha-1} R2_{\alpha-\beta+2}(OC_nH_{2n+1})_\beta$ wherein, for example, $\alpha$ is an integer of 1–3, $\beta$ is 2 or 3, n is an integer of 1–3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I. $\alpha$ may be an integer of 2, and $\beta$ may be 2. In an embodiment, R may be $C_{1-6}$ hydrocarbon.

In embodiments, at least as a source gas, one type or more may be selected from dimethyl-dimethoxysilane (DM-DMOS), 1,3-dimethoxytetramethyldisiloxane (DMOT-MDS), 1,3-divinyltetramethyldisiloxan, divinyldimethylsilane (DVDMS), 1,3,5-trimethyl-1,3,5-trivinylcyclotrisiloxan (1,3,5TVS), methylvinyldimethoxysilane (MV-DMOS), divinyldiethylsilane (DV-DES), and diethyldithoxysilane (DE-DEOS).

The inert gas can be selected from the group consisting of Ar, Ne, and He. The cross-linking gas may be selected from the group consisting of ethylene glycol, 1,2-propanediol, isopropyl alcohol, diethyl ether, diisopropyl alcohol, ethylene, $CO_2$, and $N_2$.

The above-mentioned first step is described more specifically.

In an embodiment of the present invention, a method is provided to form a silicon-containing insulation film on a substrate by plasma reaction, comprising the steps of: (a) introducing a reaction gas comprising (i) a source gas comprising a silicon-containing hydrocarbon compound containing multiple cross-linkable groups, (ii) a cross-linking gas, and (iii) an inert gas, into a reaction chamber where a substrate is placed; (b) applying radio-frequency power to create a plasma reaction space inside the reaction chamber; and (c) controlling a flow of the reaction gas and an intensity of the radio-frequency power. In an embodiment, the method forms a silicon-containing insulation film on a substrate by plasma reaction, comprising the steps of: (A) introducing a reaction gas comprising (I) a source gas comprising at least one silicon-containing hydrocarbon compound containing plural alkoxy groups, (II) a cross-linking gas selected from the group consisting of C1–6 alkanol, C1–6 ether, C1–6 unsaturated hydrocarbon, CO2, and N2, and (III) an inert gas, into a reaction chamber where a substrate is placed; (B) applying radio-frequency power to create a plasma reaction space inside the reaction chamber; and (C) controlling a flow of the reaction gas and an intensity of the radio-frequency power.

As described above, the present invention includes various embodiments. For example, the radio-frequency power may be a combination of high-frequency power and low-frequency power. Further, the high-frequency power may have a frequency of 2 MHz or higher (including 5, 10, 15, 20, 25, 30, 40, 50, 60, and 70 MHz, and a range including any two of the foregoing), and the lower-frequency power has a frequency of less than 2 MHz (including 1 MHz, 800, 600, 400, 200, 100 KHz, and a range including any two of the foregoing). Alternatively, the radio-frequency power can be a single frequency power. The intensity of the radio-frequency power may be 1.5 W/cm2 or higher, and when overlaying low-frequency RF power, the intensity of the high-frequency power may be 1.5 W/cm2 or higher, and the intensity of the low-frequency power may be 0.01 W/cm2 or higher. More than two RF power frequencies can be overlaid. For example, high-frequency power (e.g., 20–30 MHz), intermediate-frequency power (e.g., 1–5 MHz), and low-frequency power (e.g., 200–800 kHz) can be overlaid.

The source gas may be a compound having the formula $Si\alpha O\alpha\text{-}1R2\alpha\text{-}\beta+2(OCnH2n+1)\beta$ wherein $\alpha$ is an integer of 1–3, $\beta$ is 2 or 3, n is an integer of 1–3, and R is attached to Si and selected from the group consisting of C1–12 hydrocarbon, C1–12 fluorohydrocarbon, C1–12 perfluorocarbon, H, D, F, Cl, Br, and I. In an embodiment, R may be C1–6 hydrocarbon. The source gas can also be comprised of a mixture of one or more of the compounds described by the formula above. In an embodiment, $\alpha$ is 1 or 2, and $\beta$ is 2. This type of source gas is disclosed in U.S. Pat. Nos. 6,352,945, 6,383,955, and 6,432,846, all of which are incorporated herein by reference in their entirety. In embodiments, the source gas may be dimethyl-dimethoxysilane (DM-DMOS), 1,3-dimethoxytetramethyldisiloxane (DMOTMDS), or phenylmethyl dimethoxysilane (PM-DMOS). Different source gases can be mixed or a single source gas can be used alone. An additional molecule that might be a useful additive to the sources listed above is 1,3-divinyl tetramethylsilane (DVTMS, [CH2=CH2Si(CH3)2]2O). Such a silicon-containing compound having unsaturated hydrocarbons can be useful to improve the mechanical strength by promoting cross-linking molecules.

The flow rate of a reaction gas and the intensity of RF power are controlled to form an insulation film having a hardness (mechanical strength) of 1.0 GPa or higher, or 2.5 GPa or higher, depending on the type of source gas, for example.

The inert gas can be any suitable inert gas including Ar, Ne and He. The reaction gas may further comprise an oxygen-supplying gas. The oxygen-supplying gas can be any suitable gas which can supply oxygen and may include $O_2$, NO, $O_3$, $H_2O$ and $N_2O$. In an embodiment, the oxygen-supplying gas may be supplied at a flow rate lower than that of the source gas. The inert gas may be supplied at a flow rate of 15–300% (50% or more in an embodiment) of that of the source gas.

In an embodiment, the cross-linking gas may be a $C_{2\text{-}4}$ alkanol such as ethylene glycol, 1,2-propanediol, and isopropyl alcohol. In another embodiment, the cross-linking gas may be a $C_{2\text{-}4}$ ether such as diethyl ether. In still another embodiment, the cross-linking gas may be a $C_{2\text{-}4}$ unsaturated hydrocarbon such as $C_2H_4$, $C_3H_4$, $C_3H_6$, $C_4H_8$, $C_3H_5(CH_3)$, and $C_3H_4(CH_3)_2$. Compounds having a skeleton of a higher number of carbon atoms such as $C_{4\text{-}12}$ aromatic hydrocarbons and $C_{4\text{-}12}$ alicyclic hydrocarbons can also be used as cross-linkers if they posses reactive groups, which compounds include, but are not limited to: $C_{4\text{-}12}$ cycloalkanol such as 1,4-cyclohexane diol (b.p. 150° C./20 mm), 1,4-cyclohexane dimethanol (b.p. 283° C.), and 1,3-cyclopentane diol (80–85° C./0.1 Torr); and $C_{4\text{-}12}$ alicyclic hydrocarbon unsaturated compounds such as 1,2,4-trivinylcyclohexane (b.p. 85–88° C./20 mm).

Further, compounds having multiple reactive groups ('mixed' functionalities, i.e., unsaturated hydrocarbon and alcohol functionalities) can also be used as cross-linkers, which include, but are not limited to: $C_{3\text{-}20}$ ether such as ethylene glycol vinyl ether $H_2C=CHOCH_2OH$ (b.p. 143° C.), ethylene glycol divinyl ether $H_2C=CHOCH_2CH_2OCH=CH_2$ (b.p. 125–127° C.), and 1,4-cyclohexane dimethanol divinyl ether (b.p. 126° C./14 mm) $(H_2C=C(OH)-CH_2)_2-(CH_2)_6)$; and $C_{5\text{-}12}$ cycloalkanol vinyl compounds such as 1-vinylcyclohexanol (b.p. 74° C./19 mm). The higher-molecular weight type sources identified above can incorporate the desired cross-linking ligands in combination with cyclic compounds. These enable the achievement of the desired enhancement in hardness (e.g., mechanical strength) without compromising the dielectric constant because they can cross-link the linear siloxane chains, but also reduce the density of the films to a higher degree than other types of sources.

The cross-linking gas can be used singly or in any combination of the foregoing. The cross-linking gas may be supplied at a flow rate effective to cross link oligomers of compounds of the source gas, thereby increasing mechanical strength of an insulation film formed on the substrate. The flow rate of the cross-linking gas may be 20–500% of that of the source gas, depending on the type of source gas, for example.

In an embodiment, the reaction gas is excited upstream of the reaction chamber. In this embodiment, the reaction gas can be excited in a remote plasma chamber installed upstream of a reactor, and the film is deposited on a substrate in the reactor. The source gas and the additive gas (the cross-linking gas and/or the inert gas) can be introduced into the remote plasma chamber. In this case, a reaction space is composed of the interior of the remote plasma chamber, the interior of the reactor, and the interior of the piping connecting the remote plasma chamber and the reactor. Because of using the interior of the remote plasma chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in U.S. patent applications Ser. No. 09/511,934 filed Feb. 24, 2000 and Ser. No. 09/764,523 filed Jan. 18, 2001, U.S. Pat. Nos. 5,788,778, and 5,788,799. The disclosure of each of the above is incorporated herein by reference in its entirety.

Further, the excitation of the reaction gas may comprise exciting the additive gas and contacting the excited additive gas and the source gas. The excitation of the reaction gas can be accomplished in the reactor or upstream of the reactor. As described above, both the source gas and the additive gas can be excited in a remote plasma chamber. Alternatively, the excitation of the reaction gas can be accomplished by exciting the additive gas in a remote plasma chamber and mixing it with the source gas downstream of the remote plasma chamber. Alternatively, the reaction gas can be heated in a pre-heat chamber installed upstream of a reactor, the reaction gas is excited in the reactor, and film is deposited on the substrate in the reactor. The source gas and the additive gas can be introduced into the pre-heater chamber. In this case, the reaction space is composed of the interior of the pre-heater chamber, the interior of the reactor, and the interior of the piping connecting the pre-heater chamber and the reactor. Because of using the interior of the pre-heater chamber, the interior of the reactor can be significantly reduced, and thus, the distance between the upper electrode and the lower electrode can be reduced. This leads to not only downsizing the reactor, but also uniformly controlling a plasma over the substrate surface. Any suitable remote plasma chamber and any suitable operation conditions can be used in the present invention. For example, usable are the apparatus and the conditions disclosed in the aforesaid references.

Further, the excitation of the reaction gas comprises exciting the additive gas and contacting the excited additive gas and the source gas. In this embodiment, the additive gas can be excited in a remote plasma chamber, and the source gas is heated in a pre-heater chamber where the excited additive gas and the source gas are in contact, and then the reaction gas flows into the reactor for deposition of a film. In this case, deposition of unwanted particles on a surface of the remote plasma chamber, which causes a failure of ignition or firing, can effectively be avoided, because only the additive gas is present in the remote plasma chamber. The source gas is mixed with the excited additive gas downstream of the remote plasma chamber.

In another embodiment, alternative plasma conditions such as use of pulsed plasma for the high and/or low frequency radiation can be employed for further stabilization of film deposition. For example, cycles of 10–100 msec and a duty (radiation period/(radiation period+non-radiation period)) of 10–90% may be preferable.

In another aspect of the present invention, a method is provided to increase mechanical strength of a silicon-containing insulation film formed on a substrate, comprising the steps of: (a) mixing a cross-linking gas selected from the group consisting of $C_{1-6}$ alkanol, $C_{1-6}$ ether, $C_{1-6}$ unsaturated hydrocarbon, $CO_2$, and $N_2$, into a source gas comprising a silicon-containing hydrocarbon compound containing plural alkoxy groups, with an inert gas; (b) introducing the mixture gas as a reaction gas into a reaction chamber where a substrate is placed; (c) applying radio-frequency power to create a plasma reaction space inside the reaction chamber; and (d) controlling a flow of the reaction gas and an intensity of the radio-frequency power. The above described features can be applied to this aspect.

In order to form oligomers in the present invention, the residence time of a reaction gas may be controlled as disclosed in U.S. Pat. Nos. 6,352,945, 6,383,955, and 6,432,846, all of which are incorporated herein by reference in their entirety.

The flow rate of the reaction gas is determined based on the intensity of RF power, the pressure selected for reaction, and the type of source gas and cross-linking gas. The reaction pressure is normally in the range of 1–10 Torr, preferably 3–7 Torr, so as to maintain a stable plasma. This reaction pressure is relatively high in order to lengthen the residence time of the reaction gas. The total flow of the reaction gas is important for reducing the relative dielectric constant of a resulting film. In general, the longer the residence time, the lower the relative dielectric constant becomes. The source gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the source gas (preferably 100–500 sccm, including 150, 200, 250 sccm) is expected to be included in the reaction gas.

In order to adjust the reaction in the vapor phase, it is effective to add a small amount of an inert gas to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the material gas in the vapor phase can be controlled. Additionally or alternatively, neon (Ne) can be used for the same purpose. Molecules of the reaction gas undergo polymerization in the vapor phase, thereby forming oligomers. The oligomers are expected to have an O:Si ratio of 1:1. However, when the oligomers form a film on the substrate, the oligomers undergo further polymerization, resulting in a higher oxygen ratio. The ratio varies depending on the relative dielectric constant or other characteristics of a film formed on the substrate. In view of the above and also reaction efficacy, oxygen is supplied to adjust a Si/O ratio in the reaction gas.

As the above process and compound, for example, the process and compound disclosed in U.S. patent application Ser. No. 10/351,669 filed on Jan. 24, 2003 may be used. The disclosure of the above is incorporated herein by reference in its entirety. By using such methods, an insulation film having a low dielectric constant (of 2.8 or lower in an embodiment; further 2.7, 2.6, 2.5, 2.4, 2.3, and a range including any one of the foregoing) and relatively high mechanical strength (an elastic modulus of 5.0 GPa or higher in an embodiment; further 6.0 GPa, 7.0 GPa, 8.0 GPa, 9.0 GPa, 10.0 GPa, 11.0 GPa, and a range including any one of the foregoing) can be formed. In the present invention, a second step further increasing the mechanical strength by exposing the insulation film to electron beam radiation is conducted.

For the purpose of improving the mechanical strength and stability of thin films such as insulation films, low dielectric constant films and resist films used for semiconductor manufacturing, methods of curing the thin films by irradiation of electron beam, ultra-violet ray, etc. have been examined. Particularly, in order to improve low dielectric constant films, electron beam irradiation is effective. As an electron beam source used for this purpose, there are two methods: a filament electron beam gun method accelerating thermo electrons emitted by heating a metal by a voltage difference between the electrodes and a plasma electron beam gun method using plasma electrons.

The filament electron beam gun method uses a metal having high heat resistance such as tungsten as a filament by heating it by resistance heating to a high temperature. In this case, if a reactive gas such as oxygen atoms exists in a space wherein the filament is placed, a phenomenon that the filament metal deteriorates by reacting to the gas occurs. Additionally, gas molecules near the filament are ionized by colliding against accelerated electrons; the ionized molecules are accelerated toward the filament by an electric field for accelerating the electrons, and collide against the filament portion. This phenomenon further accelerates deterioration of the filament portion. Due to this deterioration, the lifetime of the filament decreases and the frequency of replacing the filament increases. As a result, a continuous operation cycle of the electron beam irradiation process shortens, and eventually process throughput drops. Additionally, the deteriorated filament portion causes contamination by metal shatters, thereby causing serious problems in semiconductor reliability. Particularly, because a large amount (approximately 10%–70%) of oxygen is contained in an insulation film or a low dielectric constant film, degasification occurs from within the film by electron beam irradiation, thereby causing significant damage to the electron beam gun portion.

As a method for protecting the filament portion from these reactive gases, a method for blocking degasification from a process chamber where a substrate is placed by isolating an electron beam gun chamber where the filament and the accelerating electrodes are placed from the process chamber by a metal thin film such as Si has been proposed. For example, in U.S. Pat. Nos. 5,414,267, 6,239,543, a vacuum-tube type electron-beam gun possessing an electron-beam irradiation aperture is disclosed. The above aperture comprises a thin film such as Si and Ti, thereby isolating the filament from degasification. In order to cover a broad range by this tube type, multiple electron beam guns are provided.

Electrons, however, are absorbed after having penetrated into a metal thin film, thereby causing an electron dose loss problem. When increased accelerating voltage is used, the penetrating power of electron beam decreases exponentially. Additionally, if the radiation dose is increased, a heat generation problem occurs. Thickening a blocking film can be considered in order to prevent damage caused by heat generation. Thickening the film, however, further increases the electron loss.

In order to expose a thin film used for semiconductor manufacturing to electrons, controlling the accelerating voltage is required to lower electron energy so that the electron energy does not reach a transistor portion formed in the vicinity of a substrate; lowering the electron energy to the utmost is preferable. When a low dielectric constant film having low density is exposed to electron beam, low energy irradiation of approximately 20 keV or lower is required. If the blocking film is used, electron loss is significant, and the required irradiation dose cannot be obtained in view of throughput.

Additionally, instead of the tube type of the apparatus, an apparatus using a large-area electron source is disclosed in U.S. Pat. Nos. 5,003,178, 6,582,777. Because it is difficult that an embodiment using a large-area electron source possesses a large vacuum window and maintains a high vacuum, a grid anode is provided between a vacuum chamber and a target in the above-mentioned apparatus; a plasma is maintained while protecting electrons from reaching the target by making a distance between the cathode and the grid less than the mean free path length of electrons leaving the cathode. The configuration of the same kind, however, cannot be applied to the filament electron beam gun type.

As described above, although electron-beam apparatuses have special apparatus characteristics according to the types, any types can be used for the above-mentioned second step process of the insulation film. As the process conditions, the conditions applied to the second invention of the present invention described later can be applied. However, because the above insulation film already possesses high mechanical strength and a low dielectric constant, the electron beam irradiation can be conducted in a wide range of conditions without setting a particular limit and desired film characteristics can be achieved.

In an embodiment, the mechanical strength can be enhanced while keeping a dielectric constant low, by setting the conditions for exposing the silicon-containing insulation film to electron beam radiation to: Emission current at 1–100 mA (preferably 5–50 mA; accelerating voltage at 0.1 k–100 kV (preferably 1 k–15 kV); a semiconductor temperature at 10–600° C. (preferably 50–550° C.); the dose at 1–100,000 $\mu C/cm^2$ (preferably 100–5,000 $\mu C/cm^2$); the degree of vacuum at $10^{-6}$–10 Torr (preferably $2 \times 10^{-6}$–$5 \times 10^{-3}$ Torr). The degree of vacuum in the electron beam irradiation is adjusted by whether an inert gas is introduced or not; an inert gas introduced may be selected from the group consisting of Ar, Ne, and He. The irradiation time is approximately 20 sec.–15 min. (preferably 1 min.–10 min.) and is adjusted according to a film thickness.

Consequently, by optimizing the electron beam irradiation conditions, an insulation film having a dielectric constant of 2.8 or lower and an elastic modulus of 15 GPa or higher is formed, or an insulation film having a dielectric constant of 2.6 or lower and an elastic modulus of 12 GPa or higher is formed. In other words, without substantially altering its dielectric constant before and after the electron beam irradiation (approximately 1% can be increased), the elastic modulus of the insulation film can be increased by 1–10 GPa (3–7 GPa in an embodiment). Although the above insulation film has a porous structure, the structure already possesses relatively high mechanical strength, and thus, by electron beam irradiation, the structure is not collapsed and the density of the film is not changed significantly. Accordingly, it is possible to increase mechanical strength of the insulation film without substantially altering its dielectric constant.

No particular restriction is applied to the electron beam apparatus in the above first invention. However, in an embodiment, the apparatus possesses the following configuration conditions: The electron beam apparatus provided with a filament electron beam gun accelerating electrons by applying an electric field to thermo electrons generated by heating a metal as an electron source. The electron beam apparatus comprises a vacuum chamber possessing the electron beam gun, a magnetic field generation unit for controlling loci of electrons, and an inert gas introduction system; and a vacuum chamber comprising an exhaust system where a substrate is placed; a partition wall is provided between the electron beam gun chamber and a process chamber, wherein the partition wall has an aperture through which electrons and gases can freely pass between inside the electron beam gun chamber and inside the process chamber.

In the above, in an embodiment, the electron beam gun comprises a single filament and an anode. Additionally, in an embodiment, a filament, an anode, an aperture, and a supporting structure supporting a substrate are provided coaxially. Furthermore, the aperture may also be provided on the same axis. Additionally, in an embodiment, a bore diameter of the aperture is smaller than an outside diameter of the filament and an outside diameter of a substrate; in an embodiment, a bore diameter of the aperture is larger than an outside diameter of the filament and smaller than an outside diameter of a substrate. Furthermore, in an embodiment, an exhaust port of the inert gas introduction system is disposed upstream of the filament. Additionally, the process chamber may comprise a process chamber and an intermediate chamber, and the exhaust system may also be provided in the intermediate chamber.

A second invention in the present invention is a method for exposing a substrate to a specific electron beam radiation after an insulation film (a dielectric film) is formed on the substrate. In this case, insulation film types are not particularly limited; in addition to the silicon-containing hydrocarbon insulation film described in the first invention of the present invention, for example, the silicon-containing hydrocarbon insulation film disclosed in U.S. Pat. Nos. 6,455,445, 6,432,846, 6,514,880, etc. and further dielectric films other than silicon-containing dielectric films may be included. With intent to improve mechanical strength of an insulation film while maintaining its low dielectric constant, it is preferred to target an oligomer having siloxane which is a porous insulation film having a linear structure.

An embodiment of the second invention is a method for processing an insulation film on a substrate by exposing it to electron beam radiation. After the insulation film is formed on the substrate, the method comprises the steps of: (a) placing the substrate on which the insulation film is formed in a process chamber; (b) introducing an inert gas into an electric gun chamber possessing an electron beam gun comprising a single filament and an anode, which is provided upstream of the process chamber; (c) emitting electrons from the electron beam gun; (d) letting the electrons pass through an aperture provided in a partition wall disposed between the electron beam gun chamber and the process chamber while discharging the inert gas from the electric beam gun chamber (the electron beam gun, the aperture, and the substrate here are disposed coaxially and the aperture is formed along the outer loci of electrons emitted from the electron beam gun toward the substrate); (e) improving the mechanical strength of the insulation film by exposing it to electron beam emitted from the electron beam gun; and (f) exhausting degasification components generated from the insulation film and the inert gas from the electron beam gun chamber. In the above, the inert gas can also be introduced into the process chamber during the process. Additionally, the aperture is preferably circular and devoted exclusively to an area necessary and sufficient for electron beam emitted from the electron beam gun toward the substrate.

Another embodiment is a method for processing an insulation film formed on a substrate by exposing it to electron beam radiation. After the insulation film is formed on the substrate, the method comprises the steps of: (a) placing the substrate on which the insulation film is formed in the process chamber; (b) obtaining a high vacuum inside an electron beam gun chamber provided upstream of the process chamber, wherein an electron beam gun comprising a filament and an anode is provided; (c) emitting electrons from the electron beam gun; (d) letting electrons pass through an aperture provided in a partition wall disposed between the chamber and the process chamber (the electron beam gun, the aperture and the substrate here are disposed coaxially and the aperture is formed along the outer loci of electrons emitted from the electron beam gun toward the substrate) (e) improving the mechanical strength of the insulation film by irradiating an electron beam emitted from the electron beam gun; and (f) evacuating degasification components generated from the insulation film and the inert gas from the electron beam gun chamber. In the above, an inert gas can also be introduced into the process chamber during the process. Additionally, the aperture is preferably circular and is devoted exclusively to an area necessary and sufficient for electron beam emitted from the electron beam gun toward the substrate.

By the above steps, the insulation film can be exposed to electron beam efficiently while protecting the electron beam gun. Because a single electron beam gun is provided and an aperture configured along outer loci of electrons emitted is provided coaxially, electron beam efficiently reaches the insulation film. As process conditions, in an embodiment, the mechanical strength can be enhanced while keeping a dielectric constant low, by setting emission current at 5–50 mA (10 mA, 20 mA, 30 mA, 40 mA, and a range including any one of the foregoing); accelerating voltage at 1 k–15 kV (2 kV, 4 kV, 6 kV, 8 kV, 10 kV, 12 kV, and a range including any one of the foregoing); a semiconductor substrate temperature at 50–550° C. (100° C., 200° C., 300° C., 400° C., 500° C., and a range including any one of the foregoing); the dose at 100–8000 µC/cm² (200 µC/cm², 500 µC/cm², 1000 µC/cm², 2000 µC/cm², 3000 µC/cm², 5000 µC/cm², and a range including any one of the foregoing); the degree of vacuum at $2\times10^{-6}$–$5\times10^{-3}$ Torr ($5\times10^{-6}$ Torr, $10^{-5}$ Torr, $5\times10^{-5}$ Torr, $5\times10^{-4}$ Torr, and a range including any one of the foregoing). The degree of vacuum in the electron beam irradiation process is adjusted by whether an inert gas is introduced or not; an inert gas introduced can be selected from the group consisting of Ar, Ne, and He. The irradiation time is approximately 30 sec.–10 min. (1 min., 2 min., 4 min., 6 min., 8 min., and a range including any one of the foregoing). In the second invention as well, a nearly equal effect on mechanical strength improvement to that of the first invention can be expected.

An electron beam apparatus which is a third invention of the present invention possesses the following configuration conditions according to an embodiment: An electron beam apparatus provided with a filament electron beam gun accelerating electrons by applying an electric field to thermo electrons generated by heating a metal as an electron source. The electron beam apparatus comprises a vacuum chamber comprising one electron beam gun comprising one filament and one anode, a magnetic field generation unit for controlling loci of electrons, and an inert gas introduction system; and a vacuum chamber comprising an exhaust system wherein a substrate is placed, wherein a partition wall is provided between the electron beam gun chamber and the process chamber; the partition wall has an aperture through which electrons and gases can freely pass between inside the electron beam gun chamber and inside the process chamber. In the above, a supporting structure supporting the filament, the anode, the aperture, and the substrate is provided coaxially. Additionally, a bore diameter of the aperture is larger than an outside diameter of the filament and smaller than an outside diameter of a substrate and the aperture is formed along outer loci of electrons emitted from the electron beam gun. Preferably, the aperture is circular and is devoted exclusively to an area necessary and sufficient for electron beam emitted from the electron beam gun toward the substrate. Furthermore, in an embodiment, an inlet port of the inert gas introduction system is disposed upstream of the filament. Additionally, by providing an intermediate chamber between the electron beam gun chamber and the process chamber, the exhaust system may be provided in the intermediate chamber as well as the partition wall may be disposed in the intermediate chamber. Additionally, in an embodiment, magnetic fields for controlling loci of electrons are generated separately in the x-axis and in the y-axis with respect to a surface of the insulation film. The frequency used for the x-axis may be 10–100 Hz, and the frequency used for the y-axis may be 100–1,000 Hz. Further, in an embodiment, magnetic fields for controlling loci of electrons may be generated by selecting the frequency used for the y-axis being mathematically indivisible by the frequency used for the x-axis. Additionally, in an embodiment, a static electricity eliminator being selected from the group consisting of a UV radiation device and a device for introducing an ionized gas is attached to the process chamber.

A preferable electron beam apparatus which can be used in the present invention is described below.

As an example, a schematic diagram of the electron beam apparatus is illustrated in FIG. 1. The electron beam apparatus which can be used in the present invention is not limited to this figure. Various changes and modifications can be made to the embodiments presented herein by those skilled in the art without departure from the spirit and scope of this invention.

The above apparatus is of the type of dispersing (scanning) by use of point source (one filament) and comprises an electron beam gun chamber 1 (a vacuum chamber) possessing a filament 10 and having an inert gas introduction system 7, a process chamber 3 (a vacuum chamber) where a substrate 5 is placed, and an intermediate chamber 2 disposed between the two chambers and possessing an exhaust system. An exhaust pipe 6, for example, leading to a turbo pump is connected to the intermediate chamber 2 and exhausts degasification components from the process chamber 3, and an inert gas from the electron beam gun chamber. The intermediate chamber 2 is not essential and may be provided as a prolongation of the process chamber 3. A filament 10 is not of a vacuum tube type, but is exposed to the inside of the apparatus. The filament 10 has a cathode function and generates electron beam to the process chamber 3 by being combined with an anode 8 disposed between the intermediate chamber 2 and the electron beam gun chamber 1. A shape of the filament 10 is not particularly limited and can be spiral, coiled, bar-shaped and the like. Additionally, as a material, a high melting point metal such as tungsten may be used. Additionally, a surface area of the filament may be approximately 0.1–20 cm$^2$ (0.5 cm$^2$, 1 cm$^2$, 5 cm$^2$, 10 cm$^2$, 15 cm$^2$, and a range including any one of the foregoing). A shape of the anode 8 is not particularly limited and can be a shape of a ring, a slit, a grid, a porous structure and the like. In the figure, the anode has a ring shape. A distance between the filament 10 and the anode 8 can be approximately 2–50 mm (5 mm, 10 mm, 20 mm, 30 mm, 40 mm, and a range including any one of the foregoing). Additionally, the anode may not be necessarily disposed between the electron beam gun chamber and the intermediate chamber and may be provided within the electron beam gun chamber without being exposed to the intermediate chamber.

In order to protect the filament from being damaged by degasification components, the following two measures are adopted:

1) With no gas flowing in, an internal pressure of the electron beam gun chamber is maintained at a high vacuum. At this time, an internal pressure of the electron beam gun chamber is approximately 2×10$^{-6}$ Torr. When an inert gas is not let flow, the conductance between the intermediate chamber 2 and the process chamber 3 becomes small by narrowing the aperture 9 provided between the intermediate chamber 2 and the process chamber 3, thereby enabling to prevent degasification components from flowing in from the process chamber 3.

2) An inert gas is let flow into the electron beam gun chamber 1 through an inert gas inlet pipe 7. By this, a gas flow is generated from the electron beam gun chamber 1 and the intermediate chamber 2 toward the process chamber 3, thereby enabling to block degasification components (oxygen, carbon, hydrogen) flowing into the electron beam gun chamber from the process chamber 3 and to prevent damage to the filament caused by the degasification components. Although an inert gas amount varies depending on a capacity of the electron beam gun chamber, irradiation energy, a type of a substrate, etc., in an embodiment, the amount is approximately 1–50 sccm (5 sccm, 10 sccm, 20 sccm, 30 sccm, 40 sccm, and a range including any one of the foregoing), and an internal pressure of the electron beam gun chamber is approximately 5×10$^{-6}$–5×10$^{-3}$ Torr (5×10$^{-5}$ Torr, 5×10$^{-4}$ Torr, and a range including any one of the foregoing). Additionally, as an inert gas, Helium (He) whose mass number is small is preferable; in addition to He, nitrogen, argon, etc. may be used. A position of the inert gas inlet pipe 7 is not particularly limited, but should be provided in a position forming an inert gas flow in one direction from the electron beam gun chamber 1 to the intermediate chamber 2. Additionally, in an embodiment, as illustrated in this figure, in view of protecting the filament 10, an inert gas flow is configured to be formed from the filament toward the aperture 9 (In the figure, an inert gas flows to encircle the filament, and then flows toward the aperture.). The aperture 9 is provided between the intermediate chamber 2 and the process chamber 3; it is configured that a gas flow of the inert gas introduced in the above prevents degasification components from flowing from the process chamber 3 to the electron beam gun chamber 3.

Additionally, because high-energy electron beam permeates through a substance but loses its energy, providing the aperture 9 prevents energy loss, thereby enabling efficient process. A position to provide the aperture is not particularly limited, but it is desirable to provide the aperture coaxially with the filament (further with the substrate 5). A size of the aperture is approximately 0.5–400 cm$^2$ (1 cm$^2$, 10 cm$^2$, 50 cm$^2$, 100 cm$^2$, 200 cm$^2$, 300 cm$^2$, and a range including any one of the foregoing) in cross-section area; its shape is not particularly limited but may be circular, square, slit-shaped, of a porous structure or the like.

Between the filament 10 and the anode 8, in an embodiment, electrons are accelerated by applying a voltage of approximately 1–15 kV (2 kV, 5 kV, 10 kV, and a range including any one of the foregoing). Because an electron beam gun is not of an isolation type, energy is not lost and treatment at a low voltage is possible.

The exhaust system 6 is provided in the intermediate chamber 2. By this, a pressure inside the process chamber can be reduced to approximately 2×10$^{-6}$–5×10$^{-3}$ Torr (5×10$^{-5}$ Torr, 5×10$^{-4}$ Torr, and a range including any one of the foregoing), and an inert gas from the electron beam gun chamber can be exhausted. Additionally, the exhaust system 6 may also be provided in the process chamber 3 instead of the intermediate chamber 2.

In the process chamber 3, the substrate 5 is to be placed on the supporting structure 4. The supporting structure 4 possesses a heating means; a temperature can be adjusted from room temperature to approximately 550° C. (50° C., 100° C., 200° C., 300° C., 400° C., 500° C., and a range including any one of the foregoing). Additionally, although the process chamber 3 is of a single-wafer-processing type in the figure, it can have a configuration for processing multiple substrates at a time. However, because of the configuration having one filament, a single-wafer-processing type is preferable in terms of uniformity. A distance between the substrate 5 and the anode 8 is, in an embodiment, approximately 15 cm–150 cm (30 cm, 50 cm, 100 cm, and a range including any one of the foregoing). Additionally, an irradiation area can be approximately 4 in$^2$–500 in$^2$ (10 in$^2$, 50 in$^2$, 100 in$^2$, 200 in$^2$, 300 in$^2$, 400 in$^2$, and a range including any one of the foregoing).

Additionally, magnetic fields are generated by a coil 11 separately in the x-axis and in the y-axis with respect to a surface of the substrate to control loci of electrons. The frequency used for the x-axis may be set at 10–100 Hz, and the frequency used for the y-axis may be 100–1,000 Hz. Further, magnetic fields for controlling loci of electrons may be generated by selecting the frequency used for the y-axis being mathematically indivisible by the frequency used for the x-axis. Additionally, an ion beam generation device 12 as a static electricity eliminator being selected from the group consisting of a UV radiation device, an ion beam irradiation means, and a device for introducing an ionized gas may be attached to the process chamber. Although electrons (−) may be accumulated on an insulation film and charge-up may be caused nearly on the order of 1 kV, ions (+) can be eliminated by the static electricity eliminator. Additionally, an inlet pipe 13 for introducing an inert gas to the process chamber 3 may be provided.

Figure 2:
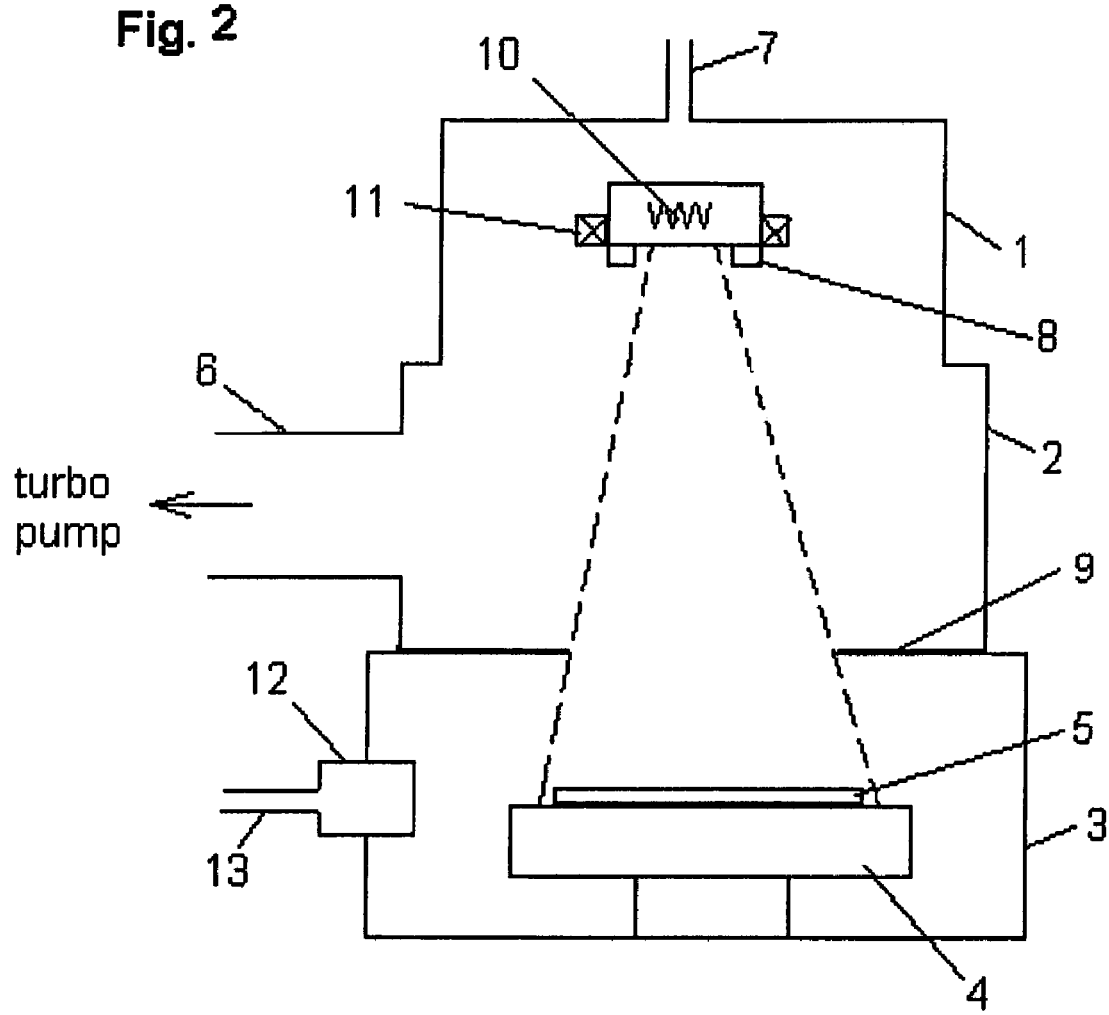
FIG. 2 is a schematic diagram illustrating a configuration of an electron beam apparatus in an alternative embodiment of the present invention.

FIG. 2 is a schematic diagram illustrating an alternative embodiment according to the present invention. In this embodiment, a partition wall 9' is tabular and an inner circumferential surface along outer loci of electrons as formed on the wall shown in FIG. 1 is not formed. FIG. 3 is a schematic diagram illustrating a further alternative embodiment. In this embodiment, similarly to FIG. 2, a partition wall 9" is tabular; however, it is disposed in a different position from FIG. 2, i.e., it is provided within the intermediate chamber 2 and being aligned with the exhaust system, not on the boundary between the intermediate chamber 2 and the process chamber 3.

EXAMPLES

Preferred embodiments of the method for forming a silicon-containing insulation film having a low dielectric constant and high mechanical strength according to the present invention are described below.

Before starting descriptions, a simple calculating formula of a scanning depth of electron beam is explained.

According to "S. Schiller, Electron Beam Technology, by John Wiley & Sons, (1983)", $$S = 0.0667 V^{5/3}/\rho$$

S: Electron Path vertical to material surface (µm)
V: Accelerating voltage (kV)
ρ: Density (g/cm$^3$)

From this formula, it is seen that changing an accelerating voltage is required per film thickness processed and film density.

It is seen that: When film density is 0.9 g/cm$^3$, accelerating voltage is 2.3 kV for a film thickness of 300 nm, 3.2 kV for 500 nm, and 7.3 kV for 2000 nm; when film density is 1.8 g/cm$^3$, accelerating voltage is 3.6 kV for a film thickness of 300 nm, 4.8 kV for 500 nm, and 11 kV for 2000 nm; and the optimum accelerating voltage range is 1 k–15 kV.

(Experiment 1)

Using the electron beam apparatus shown in FIG. 1, an experiment for exposing a low dielectric constant silicon-containing insulation film formed on a Φ300 mm silicon substrate to electron beam radiation was conducted. Additionally, the dose was calculated based on emission current/Scan area. In the case of this experiment, 10 mA/ (52 cm×52 cm)=3.7 µC/cm$^2$·sec (i.e., approximately 220 µC/cm$^2$ for one-minute treatment) was used.

Irradiation conditions:
Reaction gas used for forming an insulation film to be treated: DMDMOS, helium
Film thickness: 500 nm
Accelerating voltage: 4 kV
Pressure inside the process chamber: Pre-process, 2×10$^{-6}$ Torr (No gas introduction during the process); during the process, a level of 10$^{-5}$ Torr (During the process, the pressure gradually drops.)
Emission current: 10 mA
Substrate temperature: 150–450° C.
Magnetic field generation: x-axis=49 Hz; y-axis=500 Hz Time dependence of the dielectric constant and the elastic modulus when a substrate temperature is changed to 150–450° C. is shown in Table 1. (Because this is a destruction test to determine the elastic modulus, as the pre-process dielectric constant and elastic modulus, representative values are used instead of individual samples.)

TABLE 1

Change in Post-process Dielectric Constant and Elastic Modulus (Pre-process: k = 2.70, EM = 9.2 GPa)

| Substrate Temperature (° C.) | Process Time (min.) | Dielectric Constant (-) | Elastic Modulus (GPa) | Total Dose (µC/cm$^2$) |
|---|---|---|---|---|
| 150 | 1 | 2.72 | 11.1 | 220 |
| 150 | 2 | 2.73 | 13.6 | 440 |
| 150 | 3 | 2.71 | 15.2 | 660 |
| 300 | 1 | 2.72 | 12.5 | 220 |
| 300 | 2 | 2.73 | 15.3 | 440 |
| 450 | 1 | 2.71 | 15.4 | 220 |

From Table 1, even when a substrate temperature is changed to 150–450° C., it is seen that insulation films having a dielectric constant of 2.8 or lower and an elastic modulus of 15 GPa or higher are able to be formed.

(Experiment 2)

Using the electron beam apparatus shown in FIG. 1, an experiment for exposing a low dielectric constant silicon-containing insulation film formed on a Φ300 mm silicone substrate to electron beam radiation was conducted.

Irradiation conditions:
Reaction gas used for forming an insulation film to be treated: DMDMOS, helium
Film thickness: 500 nm
Accelerating voltage: 4 kV
Pressure inside the process chamber: Pre-process, 2×10$^{-6}$ Torr (No gas introduction during the process); during the process, a level of 10$^{-4}$–10$^{-5}$ Torr (During the process, a pressure gradually drops.)

Emission current: 40 mA

Substrate temperature: 150–450° C.

Magnetic field generation: x-axis=49 Hz; y-axis=500 Hz

Time dependence of the dielectric constant and the elastic modulus when a temperature is changed to 150–450° C. is shown in Table 2.

TABLE 2

Change in Post-process Dielectric Constant and Elastic Modulus
(Pre-process: k = 2.70, EM = 9.2 GPa)

| Substrate Temperature (° C.) | Process Time (min) | Dielectric Constant (-) | Elastic Modulus (GPa) | Total Dose (μC/cm$^2$) |
|---|---|---|---|---|
| 150 | 0.5 | 2.73 | 10.5 | 440 |
| 150 | 1 | 2.72 | 12.9 | 880 |
| 150 | 1.5 | 2.73 | 15.1 | 1320 |
| 300 | 0.5 | 2.71 | 12.7 | 440 |
| 300 | 1 | 2.73 | 15.2 | 880 |
| 450 | 0.5 | 2.72 | 15.1 | 440 |

From Experiments 1 and 2, it is seen that significant effects are obtained current set in the range of 10–40 mA and a substrate temperature set in the range from 150–450° C.

(Experiment 3)

Using the electron beam apparatus shown in FIG. 1, an experiment for exposing a low dielectric constant silicon-containing insulation film formed on a Φ300 mm silicon substrate to electron beam radiation was conducted.

Irradiation conditions:

Reaction gas used for forming an insulation film to be treated: DMDMOS, helium

Film thickness: 500 nm

Accelerating voltage: 4 kV

Pressure inside the process chamber: Pre-process $2\times10^{-6}$ Torr–$5\times10^{-4}$ Torr; during the process, a level of $10^{-4}$–$10^{-5}$ Torr (During the process, a pressure gradually drops.)

Emission current: 20 mA

Substrate temperature: 300° C.

Magnetic field generation: x-axis=49 Hz; y-axis=500 Hz

Pressure dependence of the dielectric constant and the elastic modulus when a pre-process pressure inside the process chamber is changed to $2\times10^{-6}$–$5\times10^{-4}$ Torr is shown in Table 3. From the table, it is seen that insulation films having a dielectric constant of 2.8 or lower and an elastic modulus of 15 GPa or higher are able to be formed.

TABLE 3

Change in Post-process Dielectric Constant and Elastic Modulus
(Pre-process: k = 2.70, EM = 9.2 GPa)

| Pressure (Torr) | Process Time (min) | Dielectric Constant (-) | Elastic Modulus (GPa) | Total Dose (μC/cm$^2$) |
|---|---|---|---|---|
| $2\times10^{-6}$ | 1 | 2.72 | 15.3 | 440 |
| $5\times10^{-6}$ | 1 | 2.73 | 15.5 | 440 |
| $5\times10^{-5}$ | 1 | 2.71 | 15.2 | 440 |
| $1\times10^{-4}$ | 1 | 2.72 | 15.1 | 440 |
| $5\times10^{-4}$ | 1 | 2.73 | 15.3 | 440 |

From Experiment 3, it is seen that significant effects are obtained with a pre-process pressure inside the process chamber set in the range of $2\times10^{-6}$–$5\times10^{-4}$ Torr.

(Experiment 4)

Using the electron beam apparatus shown in FIG. 1, an experiment for exposing a low dielectric constant silicon-containing insulation film formed on a Φ300 mm silicon substrate to electron beam radiation was conducted.

Irradiation conditions:

Reaction gas used for forming an insulation film to be treated: DMDMOS, helium

Accelerating voltage: 300 nm: 3.0 kV 2000 nm: 9.2 kV

Pressure inside the process chamber: Pre-process $2\times10^{-6}$ Torr (No gas introduction during the process); during the process, a level of $10^{-5}$ Torr (During the process, a pressure gradually drops.)

Emission current: 10 mA

Substrate temperature: 300° C.

Magnetic field generation: x-axis=49 Hz; y-axis=500 Hz

Change in the dielectric constant and the elastic modulus when a substrate thickness is 300 nm and 2000 nm is shown in Table 4.

TABLE 4

Change in Post-process Dielectric Constant and Elastic Modulus
(Pre-process: k = 2.70, EM = 9.2 GPa)

| Film Thickness (nm) | Process time (min) | Dielectric Constant (-) | Elastic Modulus (GPa) | Total Dose (μC/cm$^2$) |
|---|---|---|---|---|
| 300 | 0.75 | 2.71 | 15.3 | 165 |
| 2000 | 16 | 2.73 | 15.6 | 3520 |

From Table 4, it is seen that insulation films having a dielectric constant of 2.8 or lower and an elastic modulus of 15 GPa or higher are able to be formed even if the total dose is changed to 165–3520 μC/cm$^2$.

(Experiment 5)

Using the electron beam apparatus shown in FIG. 1, an experiment for exposing a low dielectric constant silicon-containing insulation film formed on a Φ300 mm silicon substrate to electron beam radiation was conducted.

Irradiation conditions:

Film thickness: 1000 nm (He was used as an inert gas for all cases of film formation.)

Accelerating voltage: The vicinity of 6 kV (According to the density of each film, the accelerating voltage was adjusted: 5.5–6.3 kV)

Pressure inside the process chamber: $2\times10^{-6}$ Torr

Emission current: 20 mA

Substrate temperature: 300° C.

Process time: 4 min

Dose: 1760 μC/cm$^2$

Magnetic field generation: x-axis=49 Hz; y-axis=500 Hz

Dielectric constant and elastic modulus values before and after exposing a low dielectric constant silicon-containing film formed using each reaction gas (source gas, cross-linking gas, oxygen-supplying gas) to electron beam radiation are shown in Table 5.

TABLE 5

Dielectric Constant and Elastic Modulus before/after Exposing Low Dielectric Constant Silicon-containing Film formed using each reaction gas (source gas, cross-linking gas, oxygen-supplying gas) to Electron Beam Radiation

| | Reaction Gas | | | Pre-process | | Post-process | |
|---|---|---|---|---|---|---|---|
| Source Gas 1 | Source Gas 2 | Cross-linking Gas | Oxygen-supplying Gas | k | EM (GPa) | k | EM (GPa) |
| DMDMOS | | | | 2.70 | 9.2 | 2.72 | 15.4 |
| DMDMOS | | | $O_2$ | 2.67 | 8.8 | 2.69 | 15.2 |
| DMDMOS | | $CO_2$ | $O_2$ | 2.67 | 10.2 | 2.69 | 16.2 |
| DMDMOS | | Ethylene glycol | | 2.69 | 10.3 | 2.68 | 15.6 |
| DMDMOS | | 1,2 propanediol | | 2.71 | 11.1 | 2.73 | 15.9 |
| DMDMOS | | $N_2$ | $O_2$ | 2.73 | 10.1 | 2.72 | 15.6 |
| *DMDMOS | | Ethylene | | 2.59 | 10.2 | 2.62 | 15.3 |
| DMDMOS | DVDMS | | | 2.72 | 10.5 | 2.73 | 16.1 |
| DMDMOS | DVDMS | | $O_2$ | 2.73 | 10.6 | 2.71 | 15.8 |
| DMDMOS | DVDES | | | 2.71 | 9.9 | 2.73 | 15.3 |
| DMDMOS | 1,3,5TVS | | | 2.69 | 9.4 | 2.71 | 15.5 |
| DMDMOS | MVDMOS | | | 2.72 | 9.6 | 2.74 | 15.2 |
| DMOTMDS | | | | 2.55 | 8.2 | 2.58 | 12.2 |
| DMOTMDS | | | $O_2$ | 2.52 | 8.8 | 2.53 | 12.3 |
| DMOTMDS | | | $CO_2$ | 2.56 | 8.9 | 2.59 | 12.6 |
| DMOTMDS | | Isopropyl alcohol | $O_2$ | 2.49 | 8.5 | 2.52 | 13.8 |
| DMOTMDS | | Diethyl ether | | 2.51 | 7.6 | 2.54 | 12.7 |
| DMOTMDS | | Diisopropyle ether | | 2.55 | 8.9 | 2.57 | 13.0 |
| DMOTMDS | DVDMS | | | 2.53 | 8.7 | 2.53 | 12.9 |
| DMOTMDS | DVDMS | Isopropyl alcohol | | 2.49 | 8.4 | 2.51 | 12.6 |
| DMOTMDS | DVDES | | | 2.57 | 8.5 | 2.58 | 12.9 |
| DMOTMDS | 1,3,5TVS | | | 2.59 | 8.8 | 2.57 | 13.2 |
| DMOTMDS | MVDMOS | | | 2.56 | 8.6 | 2.55 | 12.5 |
| DVDMS | | | | 2.75 | 9.6 | 2.78 | 16.2 |
| DVDES | | | | 2.77 | 9.7 | 2.77 | 15.8 |
| 1,3,5TVS | | | | 2.76 | 9.5 | 2.78 | 15.4 |
| MVDMOS | | | | 2.78 | 9.8 | 2.77 | 15.6 |
| DEDEOS | | | | 2.75 | 9.6 | 2.74 | 15.3 |

*In the processes using DMDMOS, film characteristics were satisfactory, but there were problems in chamber cleaning, etc.

As described above, according to the present invention, by exposing low dielectric constant silicon-containing insulation films formed on semiconductor substrates to electron beam radiation using the electron beam apparatus, the mechanical strength of the insulation film is able to be improved. Additionally, although it was difficult to use the electron beam irradiation process for industrial purposes until now, by applying the present invention, damage to the filament portion decreases and an electric beam apparatus capable of performing prolonged continuous treatment is realized.

Additionally, because the electron beam (EB) has high energy conversion efficiency, improvement of properties of a low dielectric constant film, for example, improvement of its mechanical strength can be achieved in a extremely short period of time (within several minutes to tens minutes) as compared with the heat curing treatment. By using the apparatus according to the present invention, a treatment using lower energy can be conducted, and hence it is further efficient. Additionally, throughput is remarkably improved, because a prolonged continuous treatment is possible.

Additionally, the present invention includes the following embodiments:

1) A method for forming a silicon-containing insulation film having a low dielectric constant and high mechanical strength, which is characterized by comprising a step of forming a low dielectric constant silicon-containing insulation film on a semiconductor substrate, and a step of improving mechanical strength by exposing the low dielectric constant silicon-containing insulation film formed to electron beam radiation using the electron beam apparatus.

2) The method for forming a low dielectric constant silicon-containing insulation film according to 1) above, wherein the low dielectric constant silicon-containing insulation film is formed by a plasma CVD method comprising a step of introducing a reaction gas comprising (i) a source gas comprising a silicon-containing hydrocarbon compound containing multiple cross-linkable groups, (ii) an oxygen-supplying gas according to circumstances, (iii) a cross-linking gas according to circumstances, and (iv) an inert gas, into a reaction chamber where a substrate is placed; a step of applying RF power so as to create a plasma reaction space inside the reaction chamber; a step of controlling a flow rate of the reaction gas and an intensity of the RF power.

3) The method for forming a low dielectric constant silicon-containing insulation film according to 2) above, wherein the cross-linkable groups of the silicon-containing hydrocarbon compound are alkoxy groups and/or vinyl groups.

4) The method for forming a low dielectric constant silicon-containing insulation film according to 2) above, wherein the oxygen-supplying gas is selected from the group consisting of $O_2$ and $N_2O$.

5) The method for forming a low dielectric constant silicon-containing insulation film according to 2) above, wherein the cross-linking gas is selected from the group consisting of alcohol, ether, unsaturated hydrocarbon, $CO_2$, and $N_2$.

6) The method for forming a low dielectric constant silicon-containing insulation film according to 5) above, wherein the alcohol is selected from the group consisting of $C_{1-6}$ alkanol and $C_{4-12}$ cycloalkanol.

7) The method for forming a low dielectric constant silicon-containing insulation film according to 5) above, wherein the unsaturated hydrocarbon is selected from the group consisting of $C_{1-6}$ unsaturated hydrocarbon, a $C_{4-12}$ aromatic hydrocarbon unsaturated compound, and a $C_{4-12}$ alicyclic hydrocarbon unsaturated compound.

8) The method for forming a low dielectric constant silicon-containing insulation film according to 5) above, wherein the ether is selected from the group consisting of $C_{3-20}$ ether and a $C_{5-12}$ cycloalkanol vinyl compound.

9) The method for forming a low dielectric constant silicon-containing insulation film according to 3) above, wherein the source gas is a compound expressed by the formula $Si_\alpha O_{\alpha-1} R_{2\alpha-\beta+2}(OC_n H_{2n+1})\beta$ wherein $\alpha$ is an integer of 1–3, $\beta$ is 2 or 3, n is an integer of 1–3, and R is attached to Si and selected from the group consisting of $C_{1-12}$ hydrocarbon, $C_{1-12}$ fluorohydrocarbon, $C_{1-12}$ perfluorocarbon, H, D, F, Cl, Br, and I.

10) The method for forming a low dielectric constant silicon-containing insulation film according to 9) above, wherein $\alpha$ is 1 or 2 and $\beta$ is 2.

11) The method for forming a low dielectric constant silicon-containing insulation film according to 9) above, wherein R is $C_{1-6}$ hydrocarbon.

12) The method for forming a low dielectric constant silicon-containing insulation film according to 9) above, wherein the source gas contains at least Dimethyldimethoxysilane (DMDMOS).

13) The method for forming a low dielectric constant silicon-containing insulation film according to 9) above, wherein the source gas contains at least 1,3-dimethoxytetramethyldisiloxane (DMOTMDS).

14) The method for forming a low dielectric constant silicon-containing insulation film according to 9) above, wherein the source gas contains at least 1,3-divinyltetramethyldisiloxan (DVTMDS).

15) The method for forming a low dielectric constant silicon-containing insulation film according to 3) above, wherein the source gas contains at least divinyldimethylsilane (DVDMS).

16) The method for forming a low dielectric constant silicon-containing insulation film according to 3) above, wherein the source gas contains at least 1,3,5-trimethyl-1,3,5-trivinylcyclotrisiloxan (1,3,5-TVS).

17) The method for forming a low dielectric constant silicon-containing insulation film according to 9) above, wherein the source gas contains at least MV-DMOS.

18) The method for forming a low dielectric constant silicon-containing insulation film according to 9) above, wherein the source gas contains at least DV-DES.

19) The method for forming a low dielectric constant silicon-containing insulation film according to 3) above, wherein the source gas contains at least DE-DEOS.

20) The method for forming a low dielectric constant silicon-containing insulation film according to 2) above, wherein the inert gas is selected from the group consisting of Ar, Ne, and He.

21) The method for forming a low dielectric constant silicon-containing insulation film according to 2) above, wherein the cross-linking gas is $C_{2-4}$ alkanol.

22) The method for forming a low dielectric constant silicon-containing insulation film according to 21) above, wherein $C_{2-4}$ alkanol is ethylene glycol, 1,2-propanediol or isopropyl alcohol.

23) The method for forming a low dielectric constant silicon-containing insulation film according to 2) above, wherein the cross-linking gas is $C_{4-6}$ ether.

24) The method for forming a low dielectric constant silicon-containing insulation film according to 23) above, wherein $C_{4-6}$ ether is diethyl ether or diisopropyl alcohol.

25) The method for forming a low dielectric constant silicon-containing insulation film according to 2) above, wherein the cross-linking gas is $C_{2-4}$ unsaturated hydrocarbon.

26) The method for forming a low dielectric constant silicon-containing insulation film according to 23) above, wherein $C_{2-4}$ unsaturated hydrocarbon is ethylene.

27) The method for forming a silicon-containing insulation film having a low dielectric constant and high mechanical strength according to 1) above, wherein the electron beam irradiation process is conducted by setting the emission current at 5–50 mA and an accelerating voltage at 1 k–15 kV in the electron beam apparatus.

28) The method for forming a silicon-containing insulation film having a low dielectric constant and high mechanical strength according to 1) above, wherein the electron beam irradiation process is conducted by setting a temperature of the semiconductor substrate at 50–550° C.

29) The method for forming a silicon-containing insulation film having a low dielectric constant and high mechanical strength according to 1) above, wherein the electron beam irradiation process is conducted by setting the dose at 100–10000 $\mu C/cm^2$.

30) The method for forming a silicon-containing insulation film having a low dielectric constant and high mechanical strength according to 1) above, wherein the electron beam irradiation process is conducted by setting the degree of vacuum at $2\times10^{-6}$–$5\times10^{-3}$ Torr.

31) The method for forming a silicon-containing insulation film having a low dielectric constant and high mechanical strength according to 30) above, wherein the degree of vacuum in the electron beam irradiation process is adjusted by whether an inert gas is introduced or not.

32) The method for forming a silicon-containing insulation film having a low dielectric constant and high mechanical strength according to 31) above, wherein the inert gas introduced in the electron beam irradiation process is selected from the group consisting of Ar, Ne, and He.

33) The electron beam apparatus according to 1) above, which comprises: a vacuum chamber comprising a filament electron beam gun accelerating electrons by applying an electric field to thermo electrons generated by heating a metal as an electron source, a magnetic-field generation unit for controlling loci of electrons, and an inert gas introduction system; and a vacuum chamber where a substrate is placed, wherein the electron beam gun chamber and the process chamber are divided by a partition wall; the partition wall has an aperture through which electrons and gases can freely pass between inside the electron beam gun chamber and inside the process chamber; an exhaust system is provided in the vicinity of the partition wall.

34) The electron beam apparatus according to 33) above, wherein the electron beam gun comprises a single filament and an anode.

35) The electron beam apparatus according to 33) above, wherein a supporting structure supporting the filament, the anode, the aperture and the substrate is provided coaxially.

36) The electron beam apparatus according to 34) above, wherein the aperture is provided on the same axis.

37) The electron beam apparatus according to 34) above, wherein a bore diameter of the aperture is smaller than an outside diameter of the substrate.

38) The electron beam apparatus according to 34) above, wherein a shape of the aperture is selected for the group consisting of a circular shape, a square shape, a slit shape, a porous structure and a three-dimensional truncated conical shape.

39) The electron beam apparatus according to 34) above, wherein an inlet port of the inert gas introduction system is disposed upstream of the filament.

40) The electron beam apparatus according to 33) above, wherein the electron beam gun chamber comprises the electron gun chamber and an intermediate chamber; the exhaust system is provided in the intermediate chamber.

41) The electron beam apparatus according to 33) above, wherein degasification components generated from the substrate and the inert gas are exhausted from the electron beam gun chamber.

42) The electron beam apparatus according to 33) above, wherein magnetic fields are generated separately in the x-axis and in the y-axis to control loci of electrons to scan the substrate.

43) The electron beam apparatus according to 33) above, wherein the magnetic-field generation unit for controlling loci of electrons has two means: generating magnetic fields separately in the x-axis and in the y-axis with respect to a surface of the insulation film to control loci of electrons to scan two-dimensionally the surface of the insulation film and generating magnetic fields to disperse electron beam.

44) The electron beam apparatus according to 42) or 43) above, wherein the frequency used for the x-axis is 10–100 Hz, and the frequency used for the y-axis is 100–1000 Hz.

45) The electron beam apparatus according to 42) or 43) above, wherein magnetic fields are generated by selecting the frequency used for the y-axis being mathematically indivisible by the frequency used for the x-axis.

46) The electron beam apparatus according to 33) above, further a static electricity eliminator provided to comprising the process chamber, the static electricity eliminator being selected from the group consisting of a UV radiation device and a device for introducing an ionized gas into the process chamber.

47) The electron beam apparatus according to 33) above, wherein the process chamber is connected to a multi-chamber type plasma CVD apparatus.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a silicon-containing insulation film on a substrate, comprising the steps of:
    introducing a reaction gas comprising (i) a source gas comprising a silicon-containing hydrocarbon compound containing multiple cross-linkable groups, (ii) a cross-linking gas, and (iii) an inert gas, into a reaction chamber where a substrate is placed;
    applying radio-frequency power to create a plasma reaction space inside the reaction chamber;
    controlling a flow of the reaction gas and an intensity of the radio-frequency power to obtain a silicon-containing insulation film on the substrate; and
    exposing the insulation film to electron beam radiation in an electron beam apparatus, the electron beam radiation step comprising:
    (i) placing the substrate in a process chamber;
    (ii) introducing an inert gas into an electron beam gun chamber which is connected to the process chamber, wherein a partition wall is disposed between the process chamber and the electron beam gun chamber, said partition wall having an aperture toward which the inert gas flows; and
    (iii) emitting electrons from an electron beam gun provided in the electron beam gun chamber toward the substrate through the aperture while discharging the inert gas from the electron beam apparatus.

2. The method according to claim 1, wherein the electron beam radiation is conducted to increase mechanical strength of the insulation film without substantially altering its dielectric constant.

3. The method according to claim 1, wherein the electron beam gun comprises a single filament and an anode, and the aperture is configured along outer loci of electrons emitted from the filament onto the substrate.

4. The method according to claim 1, wherein the pressure in the process chamber is $10^{-6}$ to $10^{-5}$ Torr.

5. The method according to claim 1, wherein prior to the electron beam irradiation, the insulation film has an elastic modulus of 5.0 GPa or higher, and a dielectric constant of 2.8 or lower, and the electron beam irradiation is conducted to increase the elastic module by 1–10 GPa without substantially altering the dielectric constant.

6. The method according to claim 1, wherein the pressure in the process chamber is $10^{-6}$ to $10^{-4}$ Torr.

7. The method according to claim 1, wherein the inert gas is helium.

8. The method according to claim 1, wherein electrons are emitted from a single filament in an irradiation area of 25–3,125 $cm^2$.

9. The method according to claim 1, wherein the electron beam dose is 50–10,000 $\mu C/cm^2$.

10. The method according to claim 1, wherein the cross-linkable groups of the silicon-containing hydrocarbon compound are alkoxy groups and/or vinyl groups.

11. The method according to claim 1, wherein the cross-linking gas is selected from the group consisting of alcohol, ether, unsaturated hydrocarbon, $CO_2$, and $N_2$.

12. The method according to claim 1, wherein the reaction gas further comprises an oxygen-supplying gas.

13. The method according to claim 1, wherein the cross-linking gas is a $C_{2-4}$ alkanol.

14. The method according to claim 1, wherein the cross-linking gas is a $C_{2-4}$ ether.

15. The method according to claim 1, wherein the cross-linking gas is a $C_{2-4}$ unsaturated hydrocarbon.

16. The method according to claim 1, wherein the cross-linking gas is supplied at a flow rate effective to cross link oligomers of compounds of the source gas, thereby increasing hardness of an insulation film formed on the substrate.

17. The method according to claim 1, wherein the reaction gas is excited upstream of the reaction chamber.

18. The method according to claim 1, wherein the intensity of the radio-frequency power is 1.5 $W/cm^2$ or higher.

19. A method for forming a silicon-containing insulation film on a substrate, comprising the steps of:

introducing a reaction gas comprising (i) a source gas comprising a silicon-containing hydrocarbon compound containing plural alkoxy groups, (ii) a cross-linking gas selected from the group consisting of $C_{1-6}$ alkanol, $C_{1-6}$ ether, $C_{1-6}$ unsaturated hydrocarbon, $CO_2$, and $N_2$, and (iii) an inert gas, into a reaction chamber where a substrate is placed;

applying radio-frequency power to create a plasma reaction space inside the reaction chamber;

controlling a flow of the reaction gas and an intensity of the radio-frequency power; and exposing the insulation film to electron beam radiation in an electron beam apparatus, the electron beam radiation step comprising:

(i) placing the substrate in a process chamber;

(ii) introducing an inert gas into an electron beam gun chamber which is connected to the process chamber, wherein a partition wall is disposed between the process chamber and the electron beam gun chamber, said partition wall having an aperture toward which the inert gas flows; and (iii) emitting electrons from an electron beam gun provided in the electron beam gun chamber toward the substrate through the aperture while discharging the inert gas from the electron beam apparatus.

20. A method for increasing mechanical strength of a silicon-containing insulation film formed on a substrate, comprising the steps of:

mixing a cross-linking gas selected into a source gas comprising a silicon-containing hydrocarbon compound containing cross-linkable groups, with an inert gas;

introducing the mixture gas as a reaction gas into a reaction chamber where a substrate is placed;

applying radio-frequency power to create a plasma reaction space inside the reaction chamber;

controlling a flow of the reaction gas and an intensity of the radio-frequency power; and exposing the insulation film to electron beam radiation in an electron beam apparatus, the electron beam radiation step comprising:

(i) placing the substrate in a process chamber;

(ii) introducing an inert gas into an electron beam gun chamber which is connected to the process chamber, wherein a partition wall is disposed between the process chamber and the electron beam gun chamber, said partition wall having an aperture toward which the inert gas flows; and (iii) emitting electrons from an electron beam gun provided in the electron beam gun chamber toward the substrate through the aperture while discharging the inert gas from the electron beam apparatus.

21. The method according to claim 20, wherein the radio-frequency power is a combination of high-frequency power and low-frequency power.

22. The method according to claim 20, wherein the high-frequency power has a frequency of 2 MHz or higher, and the lower-frequency power has a frequency of less than 2 MHz.

23. The method according to claim 20, wherein the cross-linkable groups of the silicon-containing hydrocarbon compound are alkoxy groups and/or vinyl groups.

24. The method according to claim 20, wherein the cross-linking gas is selected from the group consisting of alcohol, ether, unsaturated hydrocarbon, $CO_2$, and $N_2$.

25. A method for producing a substrate having a silicon-containing insulation film formed thereon, comprising the steps of:

forming a silicon-containing insulation film on a substrate by plasma reaction in a plasma CVD apparatus; and exposing the insulation film to electron beam radiation in an electron beam apparatus, wherein the electron beam radiation comprises the steps of:

placing the substrate in a process chamber;

introducing an inert gas into an electron beam gun chamber which is connected to the process chamber, wherein a partition wall is disposed between the process chamber and the electron beam gun chamber, said partition wall having an aperture toward which the inert gas flows; and emitting electrons from an electron beam gun provided in the electron beam gun chamber toward the substrate through the aperture while discharging the inert gas from the electron beam apparatus, wherein the electron beam gun comprises a filament and an anode, and the aperture is configured along outer loci of electrons emitted from the filament onto the substrate.

26. The method according to claim 25, wherein the electron beam radiation is conducted to increase mechanical strength of the insulation film without substantially altering its dielectric constant.

27. The method according to claim 25, wherein the pressure in the process chamber is $10^{-6}$ to $10^{-5}$ Torr.

28. The method according to claim 25, wherein the pressure in the process chamber is $10^{-6}$ to $10^{-4}$ Torr.

29. The method according to claim 25, wherein the inert gas is helium.

30. The method according to claim 25, wherein electrons are emitted from the filament in an irradiation area of 25–3,125 $cm^2$.

31. The method according to claim 25, wherein the electron beam dose is 50–10,000 $\mu C/cm^2$.

32. The method according to claim 25, wherein the aperture is circular or formed in a truncated conical shape.

33. The method according to claim 25, further comprising generating magnetic fields separately in the x-axis and in the y-axis with respect to a surface of the insulation film to control loci of electrons to scan two-dimensionally the surface of the insulation film.

34. The method according to claim 25, wherein the frequency used for the x-axis is 10–100 Hz, and the frequency used for the y-axis is 100–1,000 Hz.

35. The method according to claim 34, wherein the frequency used for the y-axis is not mathematically divisible by the frequency used for the x-axis.

36. The method according to claim 25, wherein prior to the electron beam irradiation, the insulation film has an elastic modulus of 5.0 GPa or higher, and a dielectric constant of 2.8 or lower, and the electron beam irradiation is conducted to increase the elastic module by 1–10 GPa without substantially altering the dielectric constant.

* * * * *